United States Patent
Shirasawa

(10) Patent No.: US 8,124,881 B2
(45) Date of Patent: Feb. 28, 2012

(54) PRINTED BOARD AND PORTABLE ELECTRONIC DEVICE WHICH USES THIS PRINTED BOARD

(75) Inventor: Noriyuki Shirasawa, Yokohama (JP)

(73) Assignee: Kyocera Corporation, Kyoto (JP)

( * ) Notice: Subject to any disclaimer, the term of this patent is extended or adjusted under 35 U.S.C. 154(b) by 443 days.

(21) Appl. No.: 12/394,889

(22) Filed: Feb. 27, 2009

(65) Prior Publication Data

US 2009/0211795 A1 Aug. 27, 2009

(30) Foreign Application Priority Data

Feb. 27, 2008 (JP) ................. 2008-046761

(51) Int. Cl.
*H05K 1/16* (2006.01)
*H05K 7/00* (2006.01)
*H01L 23/48* (2006.01)

(52) U.S. Cl. ........ 174/260; 174/255; 174/259; 257/687; 257/779; 257/782; 257/783; 438/108; 438/112; 438/124; 361/760; 361/762; 29/827; 29/830

(58) Field of Classification Search .......... 174/250–264; 257/676–678, 701–704, 780–789, 690, 723, 257/778, 779, E21.437, E21.508, E21.599, 257/E21.505, E23.004, E23.036, E23.188, 257/E23.125, E25.013; 438/106–118, 124, 438/125, 119, 584–586; 361/760–768, 776, 361/779, 783; 29/825–852

See application file for complete search history.

(56) References Cited

U.S. PATENT DOCUMENTS

| | | | | |
|---|---|---|---|---|
| 5,218,234 A * | 6/1993 | Thompson et al. | ........... | 257/787 |
| 5,409,863 A * | 4/1995 | Newman | ................ | 29/827 |
| 6,448,507 B1 * | 9/2002 | Fontecha et al. | ........... | 174/260 |
| 6,787,923 B2 * | 9/2004 | Tan et al. | ................ | 257/779 |
| 6,853,089 B2 * | 2/2005 | Ujiie et al. | ................ | 257/783 |
| 6,977,686 B2 * | 12/2005 | Shinomiya et al. | ........... | 348/340 |
| 7,015,592 B2 * | 3/2006 | Starkston et al. | ........... | 257/787 |
| 7,018,871 B2 * | 3/2006 | Tan et al. | ................ | 438/125 |
| 7,061,124 B2 * | 6/2006 | Tan et al. | ................ | 257/782 |
| 7,179,683 B2 * | 2/2007 | Low et al. | ................ | 438/108 |
| 7,288,725 B2 * | 10/2007 | Takeuchi et al. | ........... | 174/260 |
| 7,359,211 B2 * | 4/2008 | Landeros et al. | ........... | 361/760 |
| 7,432,602 B2 * | 10/2008 | Kuramochi | ........... | 257/783 |
| 7,807,934 B2 * | 10/2010 | Ford et al. | ................ | 174/521 |
| 2004/0095501 A1 * | 5/2004 | Aizawa et al. | ........... | 348/340 |
| 2005/0121310 A1 * | 6/2005 | Yamada et al. | ........... | 204/192.12 |

FOREIGN PATENT DOCUMENTS

| | | | | |
|---|---|---|---|---|
| JP | 404130740 A | * | 5/1992 | |
| JP | 409205103 A | * | 8/1997 | |
| JP | 2001-053411 | | 2/2001 | |
| JP | 2004235232 A | * | 8/2004 | |
| JP | 2004235547 A | | 8/2004 | |

* cited by examiner

*Primary Examiner* — Michail V Datskovskiy
(74) *Attorney, Agent, or Firm* — DLA Piper LLP (US)

(57) ABSTRACT

A printed board comprising a packaging surface on which an electronic component is packaged, an adhesion prohibited portion which is provided at a region of the printed board different from a region where the electronic component is provided, and to which adhesion of the adhesive material is prohibited, and a blocking step portion which is formed at a region between the region where the electronic component is provided and the region where the adhesion prohibited portion is provided, which blocks any adhesive material which has spilled out from between the bottom surface of the electronic component and the packaging surface from reaching the adhesion prohibited portion.

8 Claims, 6 Drawing Sheets

PRINTED BOARD AND PORTABLE ELECTRONIC DEVICE WHICH USES THIS PRINTED BOARD

BACKGROUND OF THE INVENTION

1. Field of the Invention

The present invention relates to a printed board which enables superior packaging of an electronic component to be performed, and to a portable electronic device which uses this printed board.

Priority is claimed on Japanese Patent Application No. 2008-046761, filed. Feb. 27, 2008, the contents of which are incorporated herein by reference.

2. Description of Related Art

As is commonly known, BGA (Ball Grid Array) and CSP (Chip Size Packages) are widely used as packages to house semiconductor chips. These BGA and CSP (abbreviated below to "BGA and the like") are packages which have small ball-shaped electrodes (i.e., bumps) made of solder which are arranged in a grid layout on a bottom surface thereof as connection terminals which electrically connect the printed board to semiconductor chips which are housed inside the packages. In this type of BGA and the like, an area between the bottom surface thereof which faces the printed board and the printed board is filled with an underfill material (i.e., an epoxy resin) which serves as an adhesive material. This underfill material is then heat-cured so as to become more firmly fixed on the printed board. This is in order to improve connection reliability in the face of thermal stress such as heat cycles and the like, and to improve connection reliability in the face of physical stress such as shock and bending and the like. However, because this underfill material is made to permeate into the gaps between the package and the printed board by means of a capillary phenomenon and is then heat-cured, it also permeates to the periphery of adjacent IC. Moreover, if too much underfill is used, or if the locations where it is injected are unsuitable, then the underfill material flows out from between the BGA and the like and the printed board. This overflowing underfill material adheres to screw holes and to mounting surfaces of electronic component protective components provided in the printed board and the like, so that the mounting accuracy of these components deteriorates markedly.

In Japanese Unexamined Patent Application, First Publication, No. 2001-53411 (JP 2001-53411A), a method is disclosed in which a BGA is packaged while this type of overflow of the underfill material is prevented. Namely, a method is disclosed in which a through hole via is provided in a printed board so as to correspond to the packaging location of the BGA, and after the BGA has been positioned so as to cover this through hole via, and after the bumps and the semiconductor pattern on the printed board have been electrically connected, underfill material is injected through the through hole via so as to fill the space between the BGA and the printed board. Namely, the underfill material which is injected through the through hole via in the printed board fills this space while spreading out radially in the planar direction of the board, so that the underfill material is prevented from overflowing.

However, in the conventional technology, because the through hole via is provided in a bottom surface of the printed board, the number of connection terminals formed by the ball-shaped electrodes is reduced corresponding to the size of the surface area taken up by the through hole via, so that the problem arises that restrictions are placed on the number of possible electrical connections between electronic components and the printed board.

The present invention was conceived in view of the above described circumstances, and it is an object thereof to provide a printed board and a portable electronic device which uses this printed board that, without placing any restrictions on electrical connections between electronic components and a printed board, make it possible to secure superior mounting accuracy while preventing underfill material which has overflowed from between a package and a printed board becoming adhered to screw holes or mounting surfaces formed on the printed board.

SUMMARY OF THE INVENTION

The present invention employs the following means in order to solve the above described problems.

Namely, the means employed by the present invention is A printed board comprising: a packaging surface on which an electronic component is packaged; an adhesion prohibited portion which is provided at a region of the printed board different from a region where the electronic component is provided, and to which adhesion of the adhesive material is prohibited; and a blocking step portion which is formed at a region between the region where the electronic component is provided and the region where the adhesion prohibited portion is provided, which blocks any adhesive material which has spilled out from between the bottom surface of the electronic component and the packaging surface from reaching the adhesion prohibited portion.

Moreover, a second means for solving the above described problems employed by the present invention is the printed board according to the above described first means wherein the blocking step portion is provided with a groove portion which is formed by peeling away the packaging surface.

Moreover, a third means for solving the above described problems employed by the present invention is the printed board according to the above described second means, further comprising: a resist layer which is provided on the packaging surface; wherein the groove portion is formed by peeling away the resist layer.

Moreover, a fourth means for solving the above described problems employed by the present invention is the printed board according to the above described second means, further comprising: a conductive pattern layer which is provided on the packaging surface; wherein the groove portion is formed by peeling away the conductive pattern layer.

Moreover, a fifth means for solving the above described problems employed by the present invention is the printed board according to the above described first means, wherein the blocking step portion is provided with a barrier wall portion which is formed by raising up the packaging surface.

Moreover, a sixth means for solving the above described problems employed by the present invention is the printed board according to the above described fifth means, further comprising: a resist layer which is provided on the packaging surface; wherein the blocking step portion is formed by raising up part of the resist layer.

Moreover, a seventh means for solving the above described problems employed by the present invention is the printed board according to the above described fifth means, further comprising: a silk screen printed layer which is provided on the packaging surface; wherein the barrier wall portion is formed by the silk screen printed layer.

Moreover, an eighth means for solving the above described problems employed by the present invention is the printed board according to the above described first means, wherein a plurality of the blocking step portions are provided.

Moreover, a means employed by the present invention in order to solve the above described problems is a portable electronic instrument which uses a printed board comprising: a packaging surface on which an electronic component is packaged; an adhesion prohibited portion which is provided at a region of the printed board different from a region where the electronic component is provided, and to which adhesion of the adhesive material is prohibited; and a blocking step portion which is formed at a region between the region where the electronic component is provided and the region where the adhesion prohibited portion is provided, which blocks any adhesive material which has spilled out from between the bottom surface of the electronic component and the packaging surface from reaching the adhesion prohibited portion.

According to the present invention, because a blocking step portion is formed between an adhesion prohibited portion and a package, even if adhesive material flows out from between the bottom surface of the package and the packaging surface, the overflowing adhesive material is blocked by the blocking step portion. As a result, it is possible to prevent the adhesive material reaching the adhesion prohibited portion, and no adhesive material becomes adhered to the adhesion prohibited portion. Accordingly, without placing any restrictions on electrical connections between electronic components and a printed board, it is possible to secure superior mounting accuracy for component parts of a printed board unit which are provided on the adhesion prohibited portion, and superior mounting accuracy for products incorporating this printed board.

DESCRIPTION OF THE PREFERRED EMBODIMENTS

An embodiment of the present invention will now be described with reference made to the drawings.

Figure 1A:
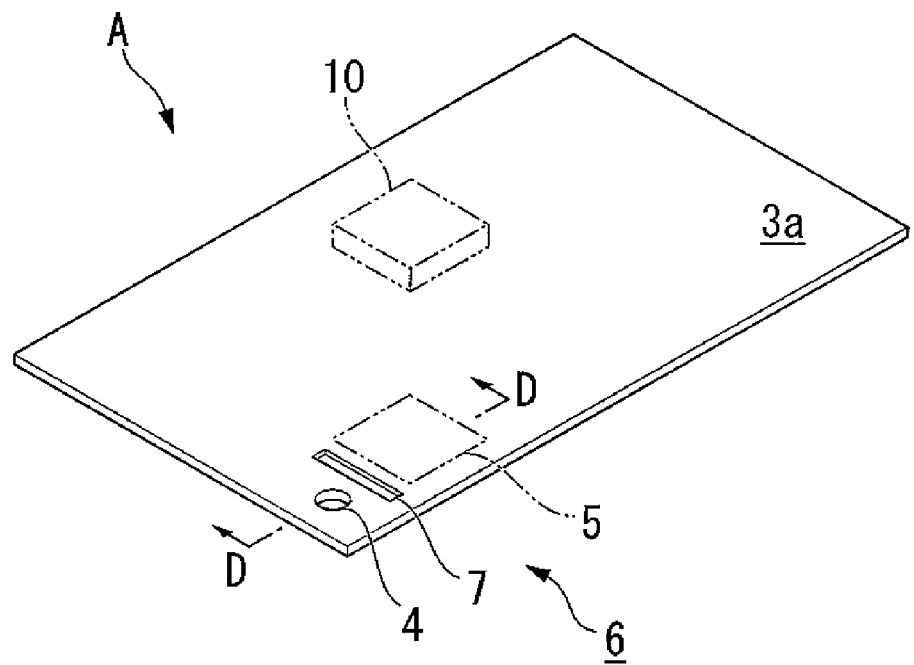
FIG. 1A is a perspective view showing a printed board A in an embodiment of the present invention.
Figure 1B:
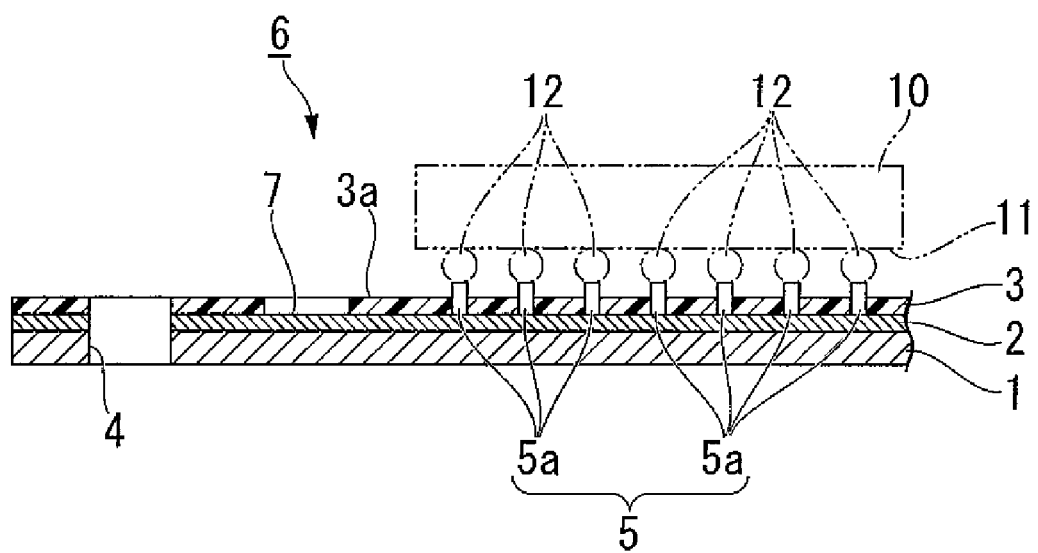
FIG. 1B is a cross-sectional view taken across a line D-D in FIG. 1A showing the printed board A in an embodiment of the present invention.

FIG. 1A and FIG. 1B show a printed board A in an embodiment of the present invention. FIG. 1A is a perspective view, while FIG. 1B is a schematic cross-sectional view taken along the line D-D in FIG. 1A.

As is shown in FIG. 1A, the printed board A is formed in a substantially rectangular-plate shape from a rigid printed board (i.e., a glass epoxy printed board) having a single layer structure on one surface thereof. As is shown in FIG. 1B, the printed board A is provided with a base material 1, a conductive pattern layer 2, and a solder resist layer 3. Namely, the conductive pattern layer 2 which is made of copper foil is formed on the base material 1, and the solder resist layer 3 which is intended to prevent the conductive pattern layer 2 from becoming corroded covers the conductive pattern layer 2. The solder resist layer 3 constitutes a packaging surface 3a for electronic components. Note that the thickness of the conductive pattern layer 2 is approximately 32 μm, while the thickness of the solder resist layer 3 is approximately 25 μm.

As is shown in FIG. 1A, this printed board A is provided with a screw hole (i.e., an adhesion prohibited portion) 4 which is used when fixing the printed board A, an electrode portion 5 which is used to connect a BGA type IC 10 (described below), and a blocking step portion 6 which is formed between the screw hole 4 and the electrode portion 5.

The screw hole 4 is formed in the vicinity of one of the four corners of the printed board A, and penetrates in a perpendicular direction relative to the packaging surface 3a. The electrode portion 5 is formed by arranging a plurality of minutely formed electrode pads 5a in a lattice pattern, and each electrode pad 5a is conductive with the conductive pattern layer 3. This electrode portion 5 is provided in the vicinity of the screw hole 4 on the packaging surface 3a.

The blocking step portion 6 is formed by a groove portion 7 created by peeling away a line-shaped portion of the solder resist layer 3, and is formed in the packaging surface 3a so as to block a virtual line connecting the screw hole 4 and the electrode portion 5.

Note that this groove portion 7 is formed by etching.

As is shown in FIG. 1B, the BGA IC 10 is formed by housing a semiconductor chip (not shown) inside a BGA package, and has a large number of bumps 12 which are formed from solder in a ball shape provided in a lattice pattern on a bottom surface 11 of the package.

Namely, when the BGA IC 10 is placed on the electrode portion 5, each bump 12 is in contact with its mutually corresponding electrode pad 5a.

When this BGA IC 10 is being packaged on the printed board A, the connection strength is supplemented by soldering the bumps 12, and in order to more firmly fix the BGA IC 10, the space between the packaging surface 3a and the bottom surface 11 is filled by an epoxy-based adhesive material, namely, by an underfill material U (see FIGS. 2A through 2F).

Next, a method of packaging the BGA IC 10 onto the printed board A will be described using FIG. 2A through FIG. 2F.

Figure 2A:
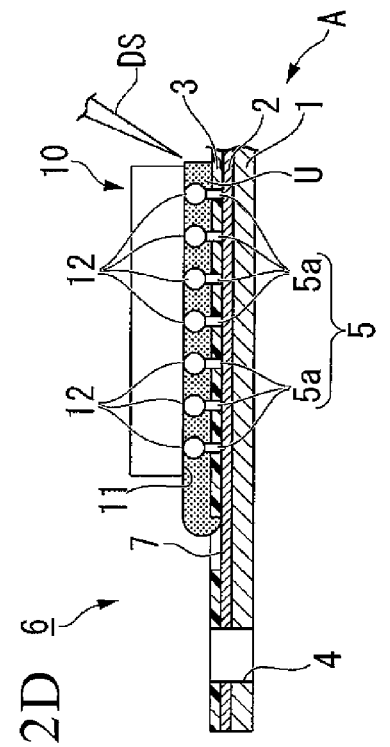
FIGS. 2A to 2F are explanatory views showing a method of packaging a BGA type IC 10 on the printed board A in an embodiment of the present invention.
Figure 2B:
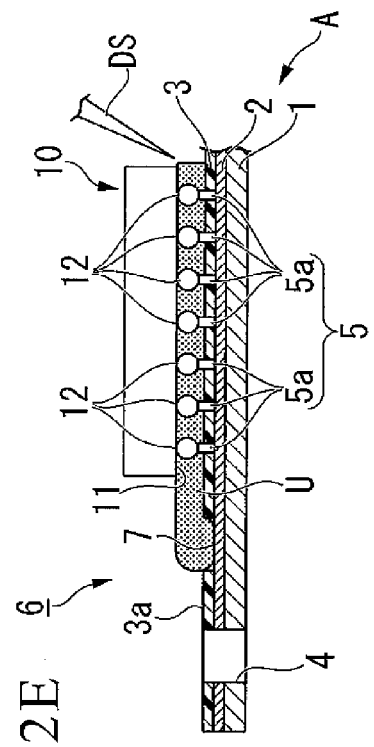

As is shown in FIG. 2A, when the bumps 12 have been heated beyond the melting point of the solder used to form the bumps 12, the BGA IC 10 is moved above the packaging surface 3a. Next as is shown in FIG. 2B, the BGA IC 10 is placed above the electrode portion 5 and the respective bumps 12 are welded to the respective electrode pads 5a, thereby electrically connecting the BGA IC 10 and the semiconductor pattern layer 2. Thereafter, the heat from the solder forming the bumps 12 is released so that the solder is hardened and becomes fixed to the electrode pads 5a. At this time, the strength of this connection is weak.

Figure 2C:
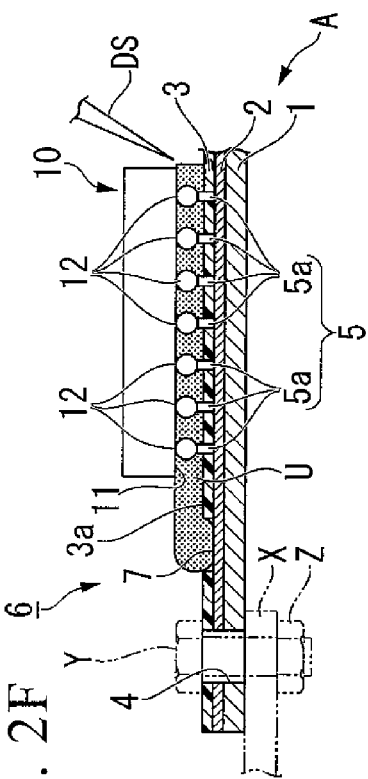

Next, as is shown in FIG. 2C, using a dispenser DS, the space between the bottom surface 11 of the BGA IC 10 and the packaging surface 3a is filled with underfill material U which is injected from a position which sandwiches the BGA IC 10 between this position and the groove portion 7. At this time, the underfill material U fills the space by spreading radially between the bumps 12 by means of a capillary phenomenon. If too much underfill material U is injected into the space, then the underfill material U flows out over the packaging surface 3a from between the bottom surface 11 of the BGA IC 10 and the packaging surface 3a, and this underfill material U advances in the direction of the screw hole 4.

Figure 2D:
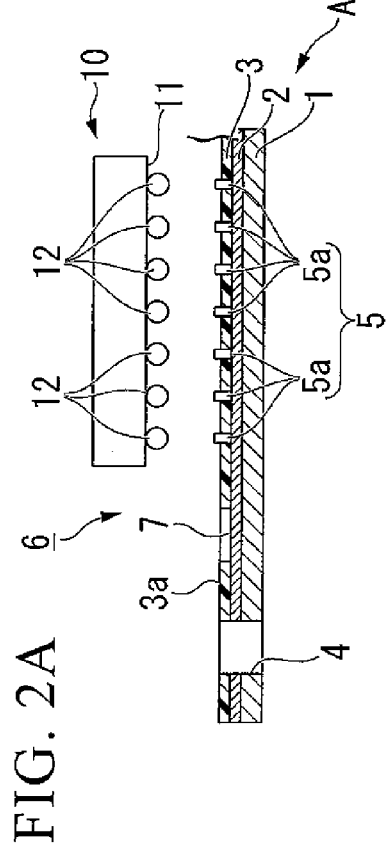
Figure 2E:
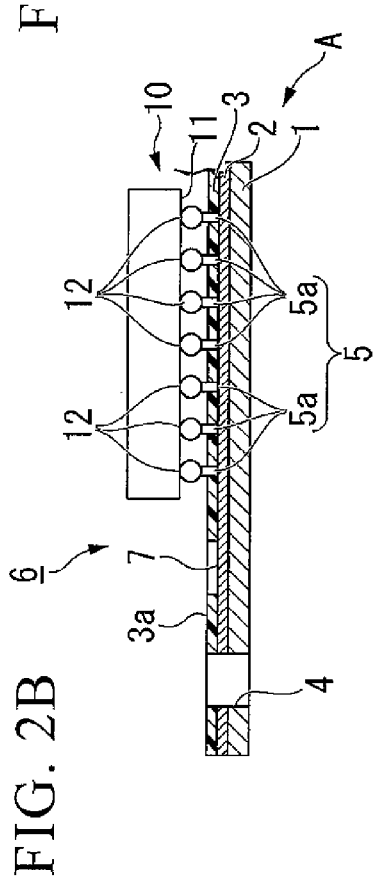

As is shown in FIG. 2D, the underfill material U which has advanced in the direction of the screw hole 4 flows into the groove portion 7, and travels along the groove portion 7 so as to reach both end portions of the groove portion 7. Next, as is shown in FIG. 2E, the underfill material U which is advancing in the direction of the screw hole 4 accumulates in the groove portion 7.

After the filling operation of the underfill material U has ended, this underfill material U is heat-cured, and the packaging of the BGA IC 10 is ended. Namely, as a result of this underfill material U being cured, the printed board A and the BGA IC 10 are firmly fixed together.

Figure 2F:
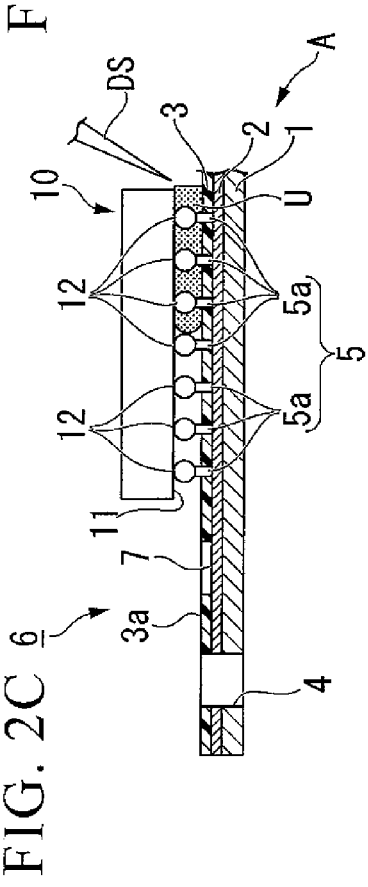

Next, as is shown in FIG. 2F, a printed board unit formed by packaging the BGA IC 10 on the printed board A is superimposed on a mounting component X, and a bolt Y is inserted through the screw hole 4 and the mounting component X, whereupon a nut Z is screwed on to the bolt Y. In this manner, the printed board unit formed by packaging the BGA IC 10 on the printed board A is fixed to the mounting component X.

As has been described above, the groove portion 7 is provided in this printed board A. Accordingly, even if underfill material U which has overflowed from between the bottom surface 11 of the BGA IC 10 and the packaging surface 3a advances in the direction of the screw hole 4, this underfill material U is allowed to flow into the groove portion 7, and after reaching both end portions of the groove portion 7 is allowed to accumulate in the groove portion 7. Namely, because the underfill material U is unable to advance to the screw hole 4, the underfill material U can be prevented from reaching the screw hole 4. As a result, it is possible to prevent the underfill material U becoming adhered to the interior of the screw hole 4 and to prevent the mounting accuracy of the bolt Y being compromised. It is therefore possible to ensure superior mounting accuracy with the mounting component X.

Next, a description will be given of the portable electronic instrument according to an embodiment of the present invention. In this portable electronic instrument, the printed board according to an embodiment of the present invention is applied to a mobile telephone B, and a printed board C (see FIG. 3) having the same structure as the above described printed board A is employed in the component parts thereof.

Figure 3:
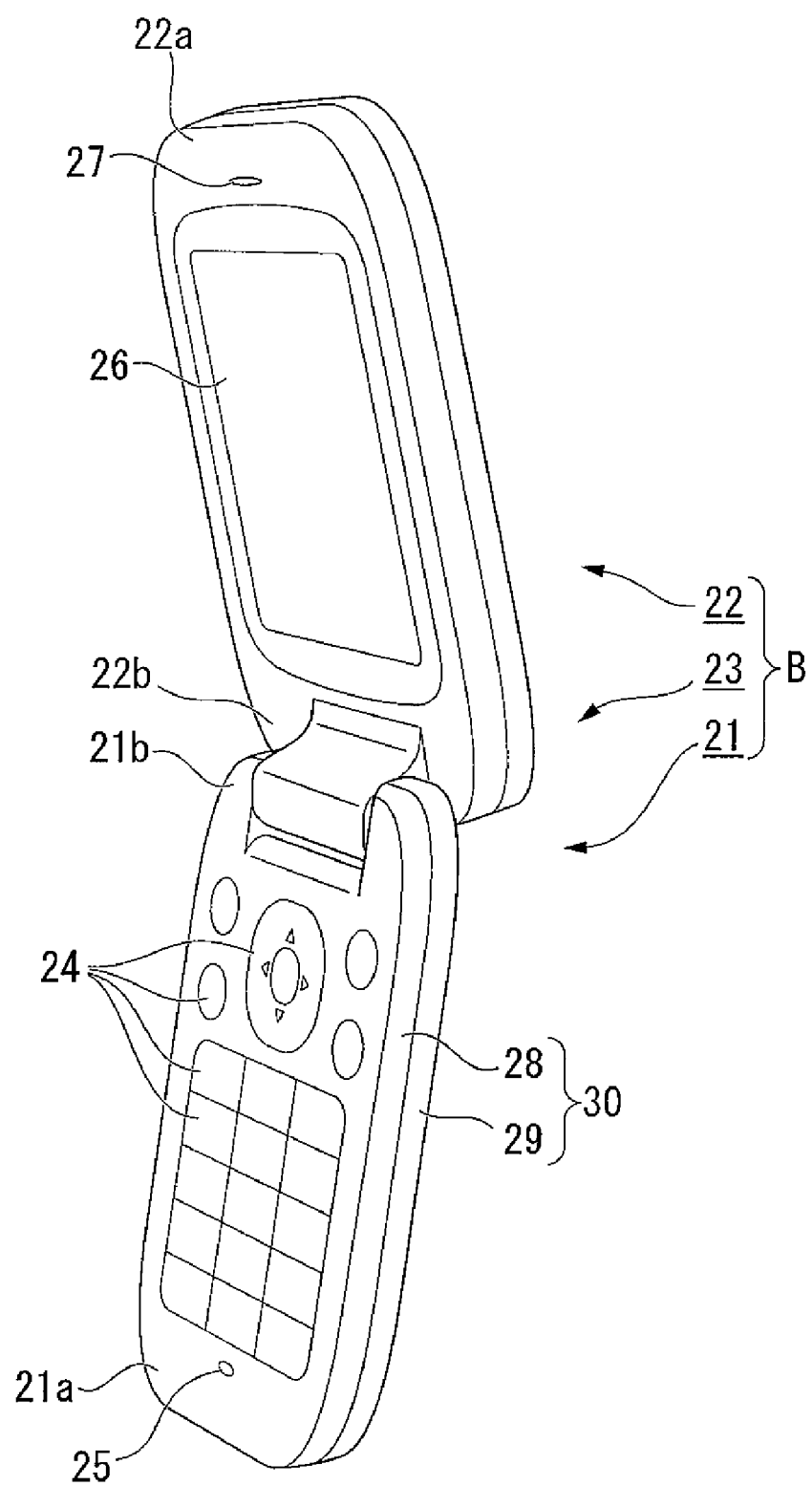
FIG. 3 is an external perspective view of a mobile telephone B in an embodiment of the present invention.

FIG. 3 is an external perspective view of the mobile telephone B. Note that in FIG. 3 through FIG. 6C, component elements which are the same as those in FIG. 1A through FIG. 2F are given the same descriptive symbols, and any description thereof is omitted. The mobile telephone B is schematically formed by an operating unit 21 and a display unit 22 which are both formed in a thin-plate shape, and by a hinge portion 23 which links these two together.

The operating unit 21 is provided with operating buttons 24 in the form of a 10-key pad which are exposed to the outside, and with a voice microphone 25 which is provided in an interior of one end portion 21a side of the operating unit 21.

The display unit 22 is provided with a display 26 which is exposed to the outside and which displays the content of an input made via the operating buttons 24, and with a speaker 27 which is provided in an interior of one end portion 22a side of the display unit 22.

The hinge portion 23 links together another end portion 21b of the operating unit 21 and another end portion 22b of the display unit 22. The operating unit 21 and the display unit 22 are able to pivot such that the one end portion 21a and the one end portion 22a are able to move relatively either towards or away from each other. Namely, the mobile telephone B is able to be folded with the operating unit 21 and a display unit 22 superimposed on each other in the thickness directions thereof.

Figure 4:
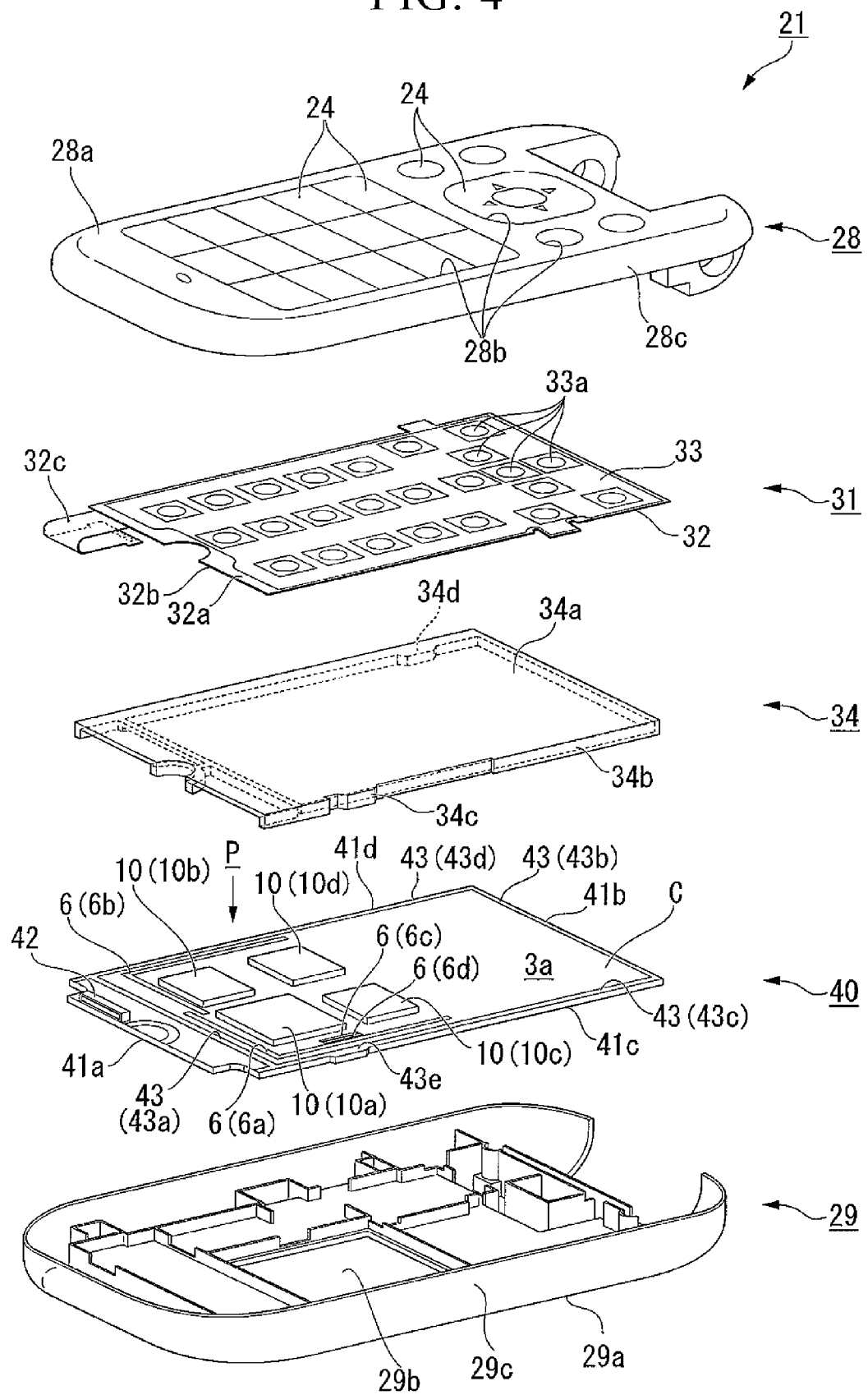
FIG. 4 is an exploded perspective view showing the structure of an operating unit 21 of the mobile telephone B in an embodiment of the present invention.

FIG. 4 is an exploded perspective view showing the structure of the operating unit 21. The operating unit 21 is provided with a box-shaped casing 30 (see FIG. 3) which is formed by an operating-side casing 28 and a supporting-side casing 29, the operating buttons 24 which are mounted on the box-shaped casing 30 so as to be exposed to the outside, a key printed board portion 31 which is housed in a housing space in the box-shaped casing 30, a shield case 34, and a main printed board unit 40.

The operating-side casing 28 has a cross-section which is formed substantially in a U shape, and has a number of through holes 28b formed in a substantially flat plate-shaped main wall 28a, and four side walls 28c having a semicircular arc-shaped cross-section are formed extending along the circumferential edge of the main wall 28a.

The supporting-side casing 29 has a cross-section which is formed substantially in a U shape, and has a battery removal portion 29b (not shown) formed in a substantially flat plate-shaped main wall 29a. Side walls 29c are formed along the circumferential edge of this main wall 29a so as to protrude in an orthogonal direction therefrom.

The box-shaped casing 30 is formed such that when the main wall 28a of the operating-side casing 28 and the main wall 29a of the supporting-side casing 29 are facing each other, end portions of both the side walls 28c and the side walls 29c are butted together so that the side walls 28c and the side walls 29c become mutually continuous.

The operating buttons 24 are formed by a 10-key and a cursor key and the like, and are mounted on the operating-side casing 28 such that they fit into the through holes 28b in the operating-side casing 28 so as to be exposed to the outside.

The key printed board portion 31 is formed by providing a metal dome sheet 33 on top of a flexible printed board 32.

The flexible printed board 32 is provided with a substantially rectangular main body portion 32a, and with a belt-shaped transmission portion 32c which extends in the longitudinal direction of the main body portion 32a from one portion of one short side 32b of the pair of short sides of the main body portion 32a which are facing each other. The metal dome sheet 33 is provided with a plurality of metal domes 33a which are positioned so as to correspond to the locations of the respective operating buttons 24, and is superimposed on the flexible printed board 32.

Namely, when an operating button 24 is depressed in an orthogonal direction relative to the main wall 28a, the metal dome 33a which corresponds to the depressed operating button 24 is deformed. A contact portion inside the metal dome 33a is then placed in electrical contact with a conductive layer of the flexible printed board 32, and electrical signals which are based on this contact state are transmitted to a main printed board unit 40 via the transmission portion 32c.

The shield case 34 is a conductive metal plate-shaped component, and is provided with a main plate 34a on which the key printed board portion 31 is superimposed, and with a supporting wall portion 34b which protrudes in an orthogonal direction relative to the main plate 34a from positions corresponding substantially to the shape of the circumferential edge of the main printed board unit 40. Moreover, this supporting wall 34b is provided with main supporting portions 34c and 34d which are formed with enlarged bonding surfaces which bond to the main printed board unit 40. These main supporting portions 34c and 34d are in key locations so as to support the downward pressing which is applied to the operating buttons 24.

Namely, this shield case 34 fixes end portions of the supporting wall 34b up against the main printed board unit 40, and supports the key printed board portion 31 using the main plate 34a, and also allows the metal dome 33a which has been depressed via an operating button 24 to be suitably deformed. Moreover, the shield case 34 covers electronic components packaged on the main printed board unit 40 by means of the main plate 34a and the supporting wall 34b so as to block out external electromagnetic waves. This shield case 34 is fixed to the main printed board unit 40 by screws.

The main printed board unit 40 is provided with a plurality of electronic components such as the BGA IC 10 (i.e., 10a through 10d) which have been packaged on the printed board C. Note that, in FIG. 4, only a portion of the plurality of electronic components packaged on the printed board C is shown.

The printed board C is formed in the same way as the printed board A in a substantially rectangular-plate shape from a rigid printed board (i.e., a glass epoxy printed board) having a single layer structure on one surface thereof. The printed board C has a pair of short sides 41a and 41b and a pair of long sides 41c and 41d, and is provided with a packaging surface 3a on which electronic components are packaged. A connector 42 into which the aforementioned transmission portion 32c of the key printed board portion 31 is inserted is provided along a portion of the short side 41a on the packaging surface 3a. Moreover, BGA IC 10 (i.e., 10a through 10d) are packaged on the packaging surface 3a within an area enclosed by a bonding portion 43 which is bonded to the supporting wall 34b of the shield case 34.

The BGA IC 10a is placed on the short side 41a side and the long side 41c side. Moreover, the BGA IC 10b is placed on the short side 41a side and the long side 41d side. In addition, the BGA IC 10c is placed in a position adjacent to the BGA IC 10a and on the long side 41d side, while the BGA IC 10d is placed in a position adjacent to the BGA IC 10b and on the long side 41c side.

The bonding portion 43 (i.e., 43a through 43d) is placed up against the supporting wall 34b of the shield case 34, and is located so as to enclose the packaged electronic components. Specifically, bonding portions 43b through 43d are positioned so as to extend alongside the short side 41b and the long sides 41c and 41d. Moreover, in the vicinity of the short side 41a, the bonding portion 43a is positioned on a straight line connecting together the bonding portions 43c and 43d. The bonding portion 43c has a bonding portion 43e at a position where it is pressed against the main supporting portion 34c.

These bonding portions 43a through 43e are not adhered to by the underfill material U, and are mounted to the shield case 34 with superior mounting accuracy.

Figure 5:
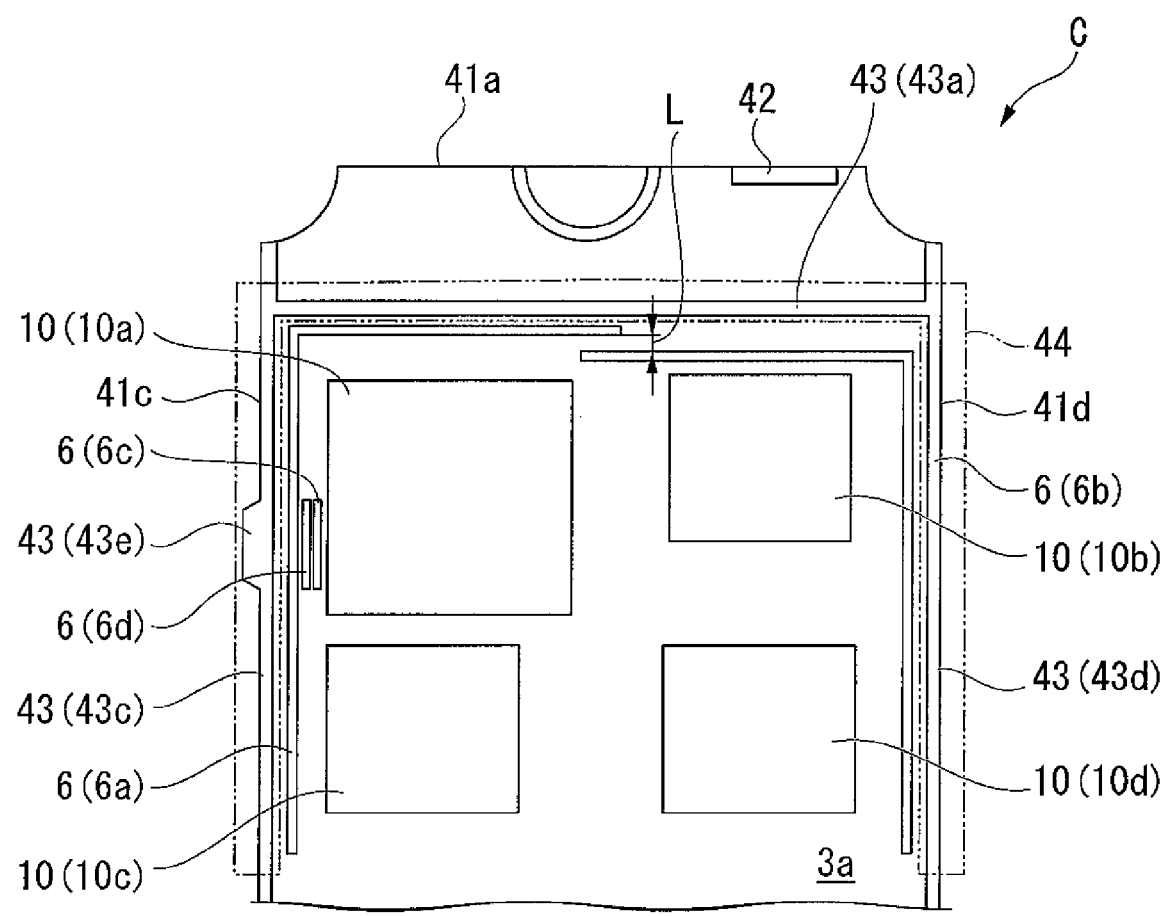
FIG. 5 is a view as seen from the direction of an arrow P in FIG. 4 showing a main printed board unit 40 in an embodiment of the present invention.

FIG. 5 is a view looking in the direction of an arrow P in FIG. 4.

In the same way as on the printed board A, blocking step portions 6 (6a through 6d) are formed on the packaging surface 3a of the printed board C. As is shown in FIG. 5, the blocking step portion 6a is formed in an inverted L-shape, and is formed between the BGA IC 10a and 10c and the bonding portion 43c, and also between the BGA IC 10a and the bonding portion 43a. Specifically, the blocking step portion 6a is formed in a straight line in parallel with the long side 41c extending from a position substantially half way along the printed board C in the longitudinal direction thereof towards the bonding portion 43a. The blocking step portion 6a then bends in the vicinity of the bonding portion 43a, and then extends in a straight line in parallel with the bonding portion 43a to a position substantially half way along the printed board C in the transverse direction thereof.

In the same way as the blocking step portion 6a, the blocking step portion 6b is formed in an L-shape when seen from the top thereof, and is formed between the BGA IC 10b and 10d and the bonding portion 43d, and also between the BGA IC 10b and the bonding portion 43a. The blocking step portion 6b is formed at a distance L from a portion of the blocking step portion 6a at a position substantially half way in the transverse direction in the vicinity of the bonding portion 43a.

The blocking step portions 6c and 6d are formed in a straight line substantially parallel with each other between a portion of the blocking step portion 6a in the vicinity of the bonding portion 43e and the BGA IC 10a.

In his manner, the blocking step portions 6a through 6d are formed alongside an adjacent bonding portion (i.e., an adhesion prevention portion) 44 of the bonding portions 43 which is adjacent to the BGA IC 10a through 10d.

According to this mobile telephone B, even if underfill material U which has overflowed from between the bottom surfaces 11 of the BGA IC 10a and 10c and the packaging surface 3a advances towards the adjacent bonding portion 44, in the same way as in the printed board A, the blocking step portions 6a through 6d are able to prevent the underfill material U reaching the adjacent bonding portion 44. Accordingly, no underfill material U adheres to the adjacent bonding portion 44. As a result, it is possible to firmly fix the supporting wall 34b of the shield case 34 to the bonding portions 43a through 43e which include the adjacent bonding portion 44, and the shield case 34 can be precisely mounted on the printed board C (i.e., the main printed board unit 40).

Moreover, because the blocking step portions 6c and 6d are formed to adjacent to the bonding portion 43e, even if the underfill material U advances towards the bonding portion 43e, the blocking step portions 6c and 6d form a preliminary barrier to prevent this underfill material U reaching the bonding portion 43e. Accordingly, the underfill material U is totally prevented from becoming adhered to the bonding portion 43e. As a result, the main supporting portion 34c of the shield case 34 can be precisely mounted on the bonding portion 43e, and it is possible to appropriately support the downward pressing of the operating buttons 24. It is also effective if they are formed apart from each other by the distance L as in the case of the blocking step portions 6a and 6b.

Note that the operating process sequence illustrated in the above embodiment, as well as the various configurations and combinations of the respective component elements are merely examples thereof, and various modifications may be made thereto based on design requirements and the like insofar as they do not depart from the spirit or scope of the present invention.

Figure 6A:
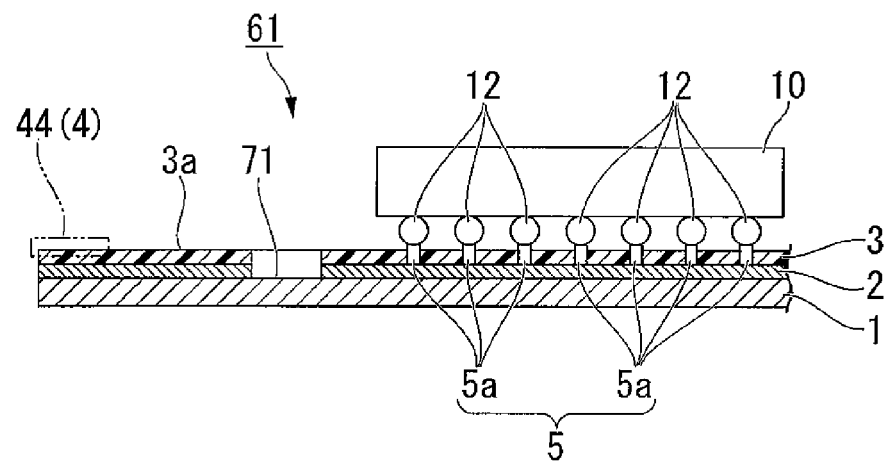
FIGS. 6A to 6C are views showing a variant example of a blocking step portion 6 in an embodiment of the present invention.
Figure 6B:
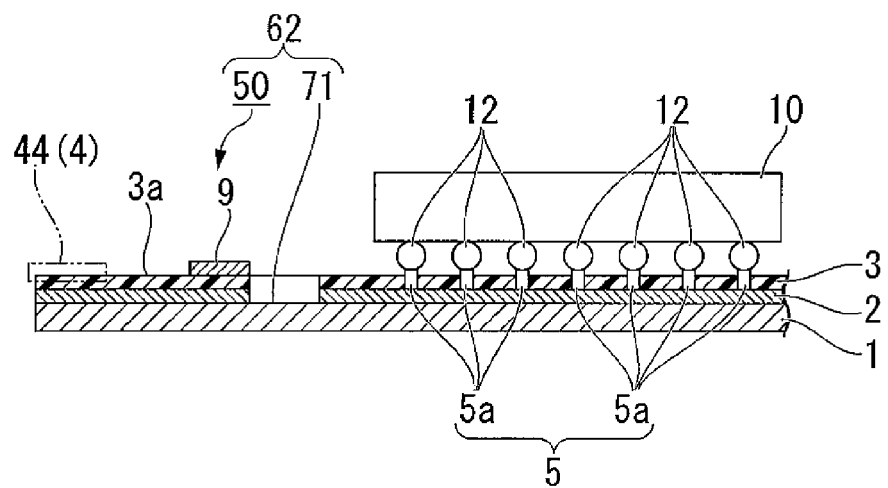
Figure 6C:
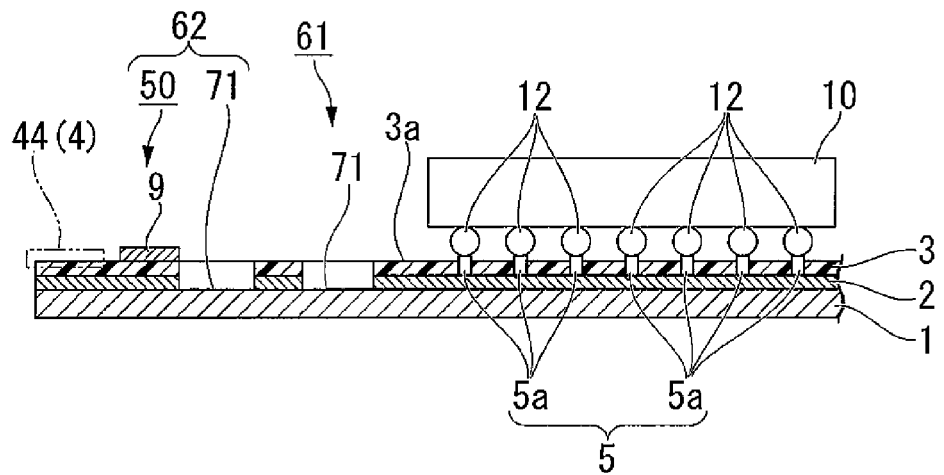

FIG. 6A through FIG. 6C show variant examples of the blocking step portions 6.

In FIG. 6A, in addition to the solder resist layer 3, the conductive pattern layer 2 is also peeled away so as to form a groove portion 71, and this groove portion 71 forms a blocking step portion 61. By forming this groove portion 71, it is possible for the amount of underfill material U which accumulates to increase. Accordingly, even if a large amount of underfill material U overflows towards the adjacent bonding portion 44 (i.e., the screw hole 4), compared to the groove portion 7, it is possible to more easily prevent this underfill material U reaching the adjacent bonding portion 44 (i.e., the screw hole 4).

In FIG. 6B, a barrier wall portion 50 is formed between the groove portion 71 and the adjacent bonding portion 44 (i.e., the screw hole 4), and a blocking step portion 62 is formed by this barrier wall portion 50 and the groove portion 71. The barrier wall portion 50 is formed by a silk screen printed layer 9 which is formed on the packaging surface 3a, and the thickness of the barrier wall portion 50 is approximately 40 μm. Namely, in order for the underfill material U to reach the adjacent bonding portion 44 (i.e., the screw hole 4), it needs to surmount the barrier wall portion 50 in addition to traversing the groove portion 71. Accordingly, it is possible to more easily prevent the underfill material U reaching the adjacent bonding portion 44 (i.e., the screw hole 4). Note that this barrier wall portion 50 may also be formed by raising the height of the solder resist layer 3.

In FIG. 6C, both the blocking step portion 61 and the blocking step portion 62 are formed. By forming both blocking step portions 61 and 62 in this manner, it is possible to prevent the underfill material U reaching the adjacent bonding portion 44 (i.e., the screw hole 4). Furthermore, in the above described embodiment, a mobile telephone is described as an example of a portable electronic device, however, the present invention may also be applied to PHS (Personal Handy phone Systems), notebook computers, PDA (Personal Digital Assistants), game machines, and the like.

What is claimed is:

1. A printed board comprising:
    a base material;
    a conductive pattern layer which is formed on the base material;
    a resist layer which covers the conductive pattern layer;
    a packaging surface on which an electronic component is packaged;
    an adhesion prohibited portion which is provided at a region of the printed board different from a region where the electronic component is provided, and to which adhesion of the adhesive material is prohibited; and
    a blocking step portion which is formed at a region between the region where the electronic component is provided and the region where the adhesion prohibited portion is provided, which blocks any adhesive material which has spilled out from between the bottom surface of the electronic component and the packaging surface from reaching the adhesion prohibited portion, wherein
    the blocking step portion is provided with a groove portion which is formed by peeling away the packaging surface, and
    the blocking step portion is formed in an L-shape.

2. The printed board according to claim 1,
    wherein the groove portion is formed by peeling away the resist layer.

3. The printed board according to claim 2,
    wherein the groove portion is formed by peeling away the conductive pattern layer and the resist layer.

4. The printed board according to claim 1, wherein the blocking step portion is provided with a barrier wall portion which is formed by raising up the packaging surface.

5. The printed board according to claim 4,
    wherein the blocking step portion is formed by raising up part of the resist layer.

6. The printed board according to claim 4, further comprising:
    a silk screen printed layer which is provided on the packaging surface;
    wherein the barrier wall portion is formed by the silk screen printed layer.

7. The printed board according to claim 1, wherein a plurality of the blocking step portions are provided.

8. A portable electronic instrument which uses a printed board comprising:
    a base material;
    a conductive pattern layer which is formed on the base material;
    a resist layer which covers the conductive pattern layer;
    a packaging surface on which an electronic component is packaged;
    an adhesion prohibited portion which is provided at a region of the printed board different from a region where the electronic component is provided, and to which adhesion of the adhesive material is prohibited; and
    a blocking step portion which is formed at a region between the region where the electronic component is provided and the region where the adhesion prohibited portion is provided, which blocks any adhesive material which has spilled out from between the bottom surface of the electronic component and the packaging surface from reaching the adhesion prohibited portion, wherein
    the blocking step portion is provided with a groove portion which is formed by peeling away the packaging surface, and
    the blocking step portion is formed in an L-shape.

* * * * *